United States Patent

Hargis

[15] 3,681,513

[45] Aug. 1, 1972

[54] HERMETIC POWER PACKAGE

[72] Inventor: Billy M. Hargis, Cleveland, Tenn.

[73] Assignee: American Lava Corporation, Chattanooga, Tenn.

[22] Filed: Jan. 26, 1971

[21] Appl. No.: 109,888

[52] U.S. Cl. ...........174/52 S, 174/DIG. 5, 174/15 R, 317/234 A, 317/234 G

[51] Int. Cl. ..............................H01l 1/12, H01l 1/14

[58] Field of Search .174/52 S, DIG. 3, DIG. 5, 15 R; 317/100, 234 A, 234 G

[56] References Cited

UNITED STATES PATENTS 3,479,570 11/1969 Gilbert ...............317/234 G UX 3,515,952 6/1970 Robinson ..................317/234 A

*Primary Examiner*—Darrell L. Clay

*Attorney*—Kinney, Alexander, Sell, Steldt & Delahunt

[57] ABSTRACT

Hermetic power packages are devices in which power-consuming chip devices or integrated circuits which generate considerable amounts of heat can be mounted and which provide thermally integral heat sinks.

4 Claims, 10 Drawing Figures

INVENTOR.
BILLY M. HARGIS
BY Kinney, Alexander, Sell, Steldt & DeLaHunt
ATTORNEYS INVENTOR.
BILLY M. HARGIS
BY Kinney, Alexander, Sell, Steldt & DeLaHunt
ATTORNEYS INVENTOR
BILLY M. HARGIS
BY Kinney, Alexander, Sell, Steldt & DeLa Hunt
ATTORNEYS

HERMETIC POWER PACKAGE

This invention relates to devices for the mounting of chips or other electronic integrated circuits which generate significant amounts of heat in operation and which must be cooled as efficiently as possible to avoid destruction by overheating.

It is well known to provide ceramic packages in which chips or integrated circuits can be mounted with leads connecting externally. Such packages may be made on a beryllia base as described by Hessinger et al., U.S. Pat. No. 3,495,023, and with heat sinks attached thereto so that heat generated within the package may be conducted away. In general, packages of the prior art are like those described by Hessinger et al. in having a ceramic base, a ceramic collar and a position within the collar on which a chip is mounted. Such packages are sealed by a suitable lid which is cemented, soldered, welded or otherwise attached to the top of the ring after the chip has been mounted within. It is a disadvantage of such devices that the base plate made of beryllia, which is heat conducting, must be relatively thick in order to be suitable as a support. If it is made of alumina, it must be of similar thickness but lacks the heat conductivity. The cost of beryllia pieces is relatively high and the toxicity of beryllia is such that it is normally avoided in ceramic processing if at all possible. Furthermore, when a beryllia base is used in the interest of economy, it is desirable that the ring surrounding the chip insert be of a cheaper material such as alumina. The sealing of alumina to beryllia by glass is only moderately successful, because the thermal coefficients of expansion of the two ceramic materials and the glass seal are sufficiently different that repeated cycling destroys the integrity of the seal rather frequently. Because of the expense attendant upon the production of such items, a ruptured seal is likely to represent a loss not only of the package unit but also of the enclosed chip unit.

It is the aim of this invention to produce a package for the mounting of chips in which good heat conduction is attained while at the same time maintaining hermetic reliability and integrity of construction with a minimization of the amount of toxic beryllia which is used. A further aim is to provide a package in which the beryllia employed is entirely enclosed and a yet further aim is to avoid the use of glass seals in such chip-mounting packages. Other aims and objectives will become evident hereinafter.

In accordance with these and the other aims and objects of the invention, it has been found that a suitable packaging unit which is termed a hermetic power package is conveniently made by attaching a suitable alumina ring or collar directly to a heat sink and mounting a small beryllia supporting chip on the heat sink within the ring using intermediate metallic contraction shim or contraction joint between the heat sink and the alumina. The shim may also be interposed between the beryllia and heat sink but this is not necessary.

The heat sink may be of whatever shape desired depending upon the application intended. It is conveniently made of copper. The ring or collar may be circular, oval, polygonal, square or rectangular as necessitated by circumstances and may be of whatever size is convenient for the chip which is to be mounted. Such variations are within the skill of the art. The shim is made of a metal having a relatively low coefficient of thermal expansion. ASTM F 30 alloy 42 composed of 42 percent nickel and 58 percent iron or F15 containing 54 percent iron, 28 percent nickel and 18 percent cobalt are suitable. The alloy available as Kovar, a trade mark of Westinghouse, is a convenient source of the latter alloy. The alumina ring or collar is advantageously made in an operation such that it has integral buried leads passing from the inside to the outside for electrical connections to the chip, a small beryllia wafer, which may be extremely thin where unusual heat conductivity is sought, is mounted on the base, i.e., the heat sink, within the surrounding ring. As a matter of fact, if electrical insulation is not necessary, it is quite possible to mount the chip directly in the heat sink, because the beryllia serves as a heat conductive electrical insulation. After the chip has been mounted and suitable connections made to terminals within the ring, a lid of ceramic or metal, as desired, is attached, e.g., soldered, to the upper surface of the ring using an intermediate low expansion metallic ring if desired and producing an hermetic seal.

Although brazing metal is introduced as preforms in the embodiments described below, it will be understood that brazing metal may also be coated on various parts as needed and that various compositions such as copper, silver, eutectic and other compositions may be employed and that any sufficiently thermally resistant solder is also embraced.

Other and more detailed objects of the invention will be apparent in the reading of the present specification and in the drawings herewith in which.

Figures 1, 2:
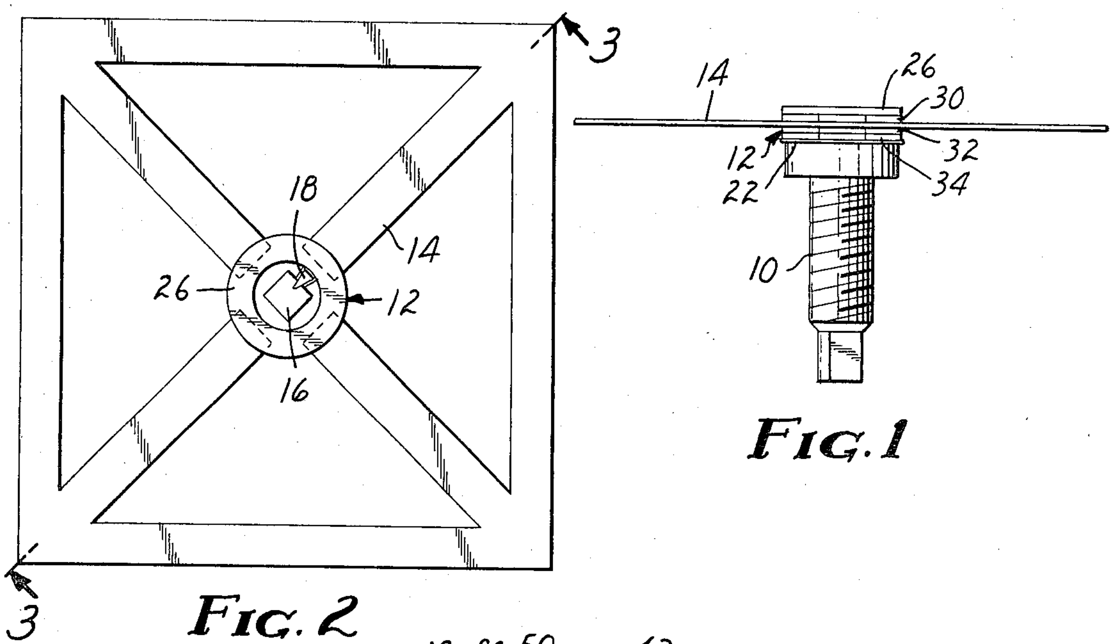
FIG. 1 is a side view of a hermetic power package of the invention.
FIG. 2 is a top view of a hermetic power package of the invention.
Figure 3:
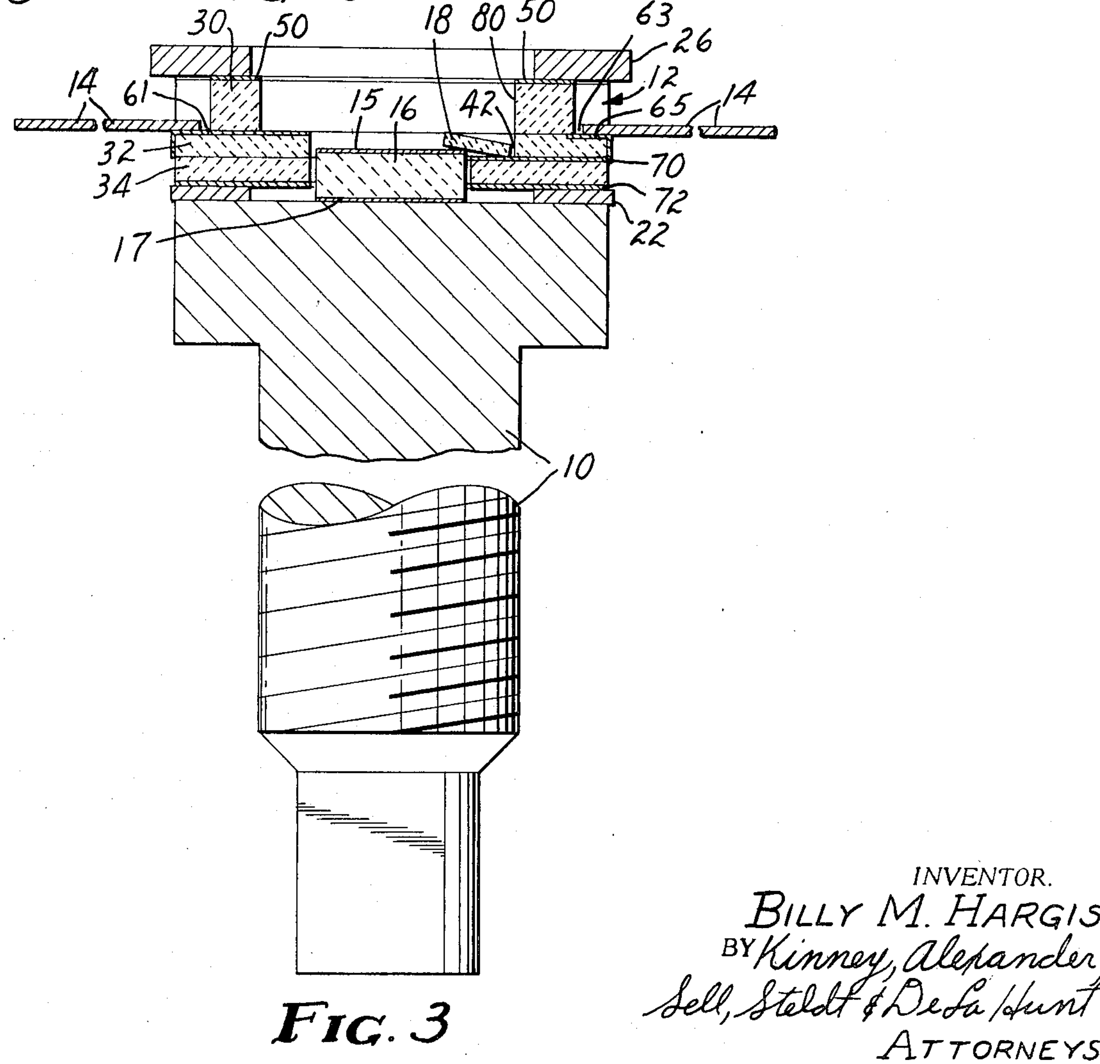
FIG. 3 is a cross-section of the hermetic power package of FIGS. 1 and 2 along the line 3—3.
Figures 4, 5, 6:
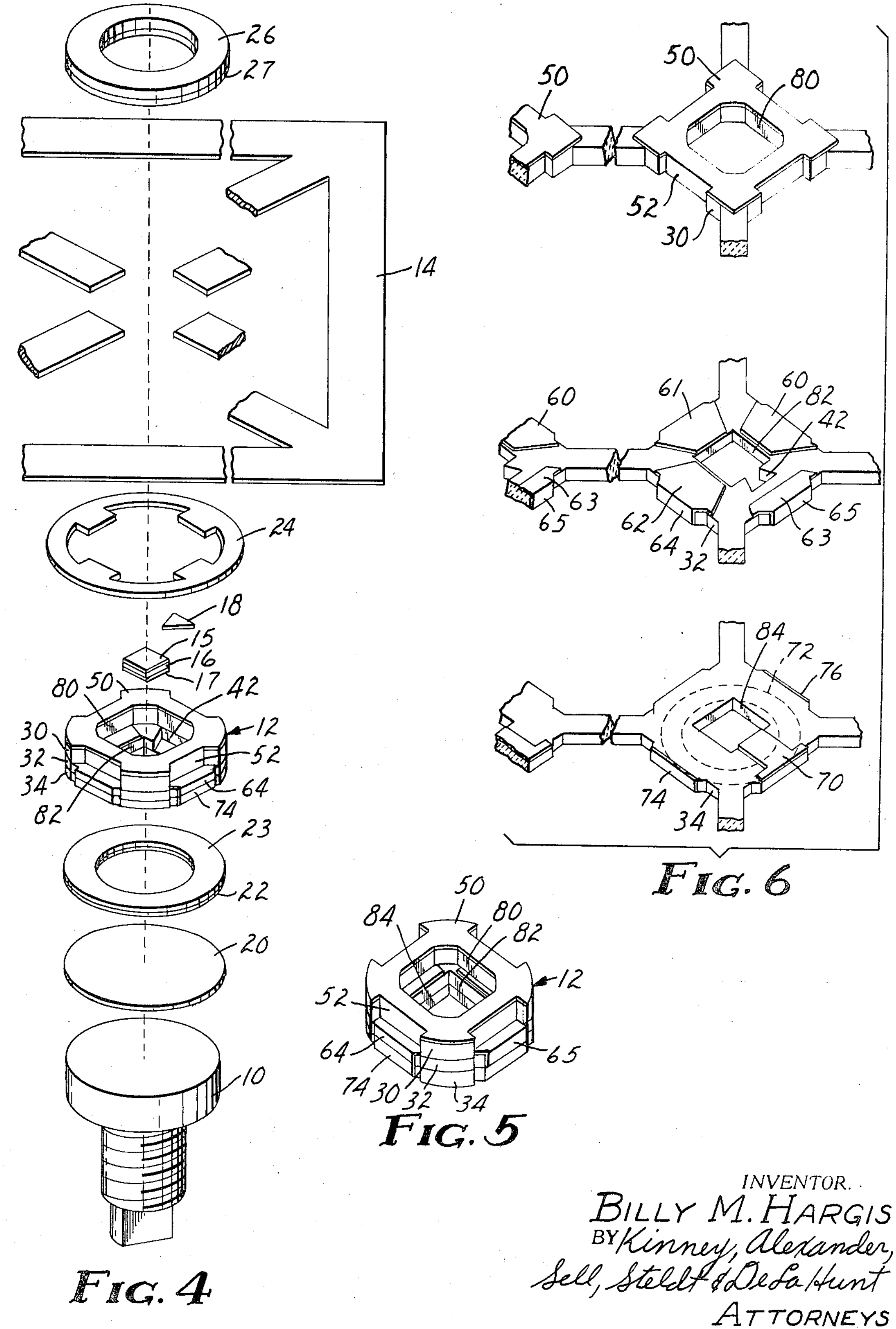
FIG. 4 is an exploded view of the hermetic power package of FIGS. 1 to 3.
FIG. 5 shows the alumina ceramic ring or collar employed in an hermetic power package of FIGS. 1 to 4 rotated through an angle of 90° from its position in FIG. 4 as it would be assembled from the segments of FIG. 6 which shows individual segments of green ceramic sheet employed in assembling the alumina ring of FIG. 5.

Referring to the figures, an hermetic power package, which is an embodiment of the invention as shown in FIGS. 1 to 4, combines a heat sink, or stud, 10 an attached alumina ring or collar 12, and lead frame 14. The stud is of a heat conducting metal such as copper, the lead frame of a ferrous alloy, nickel or copper. In addition, the enclosed beryllia chip, 16, in the embodiment of FIGS. 1 to 4 is a small metallized beryllia chip with metallic layers 15 and 17 which is electrically connected to one lead of the lead frame 14, as will become evident hereinbelow, by triangular shorting bar 18. The equilaterally triangular braze-coated shorting bar fits into notch 42 in ring 12. An annular intermediate metallic contraction shim or metallic expansion joint 22 is provided between copper stud 10 which serves as the heat sink and alumina ring 12 and Kovar seal ring 26 is provided on the top of ring 12. In the assembly operation brazing metal is provided on the copper stud by preform 20 and for attachment of lead frame 14 by lead frame preform 24. Shim 22 is provided with braze 23 and ring 26 with braze 27 for brazing to alumina ring 12. Alternatively separate brazing preforms, not shown, may be employed. Brazing metal is not shown in FIG. 3, but the preforms used are shown in FIG. 4.

Alumina ring 12 is made from sheets of leathery green ceramic available as disclosed in U.S. Pat. No. 2,966,719. Each sheet is die-cut with repeated patterns as shown in FIG. 6, the sheets are superimposed and then stamped out to give the individual pieces. The three separate segments shown in FIG. 6 are intended to show the structures repeated in each larger sheet. It will be noted that the orientation of the parts in FIG. 6 is rotated 90° clockwise from ring 12 in FIG. 4 and FIG. 2. While in sheet form, conductive patterns and overlap connectors are screened or otherwise applied to the sheets as needed. Thus, pattern 50 with overlap connector 52 is screened on sheet 30, patterns 60, 61, 62 and 63 with overlap connectors 64 and 65 are screened on sheet 32 and patterns 70 on the upper surface and 72 on the under surface with overlap connector 74 and 76 are screened on sheet 32. It will be seen that the hole 80 in sheet 30 is larger than holes 82 and 84 in sheets 32 and 34 so that when assembled portions of patterns 60, 61 and 62 are inside and outside of the ring, the triangular shorting bar 18 which fits notch 42 after firing will be seen to contact pattern 70 and by means of overlap connector 65 then contacts pattern 63. For some purposes, variations in electrical structure may be made such as omission of overlap connector 65.

Figures 7, 8, 9, 10:
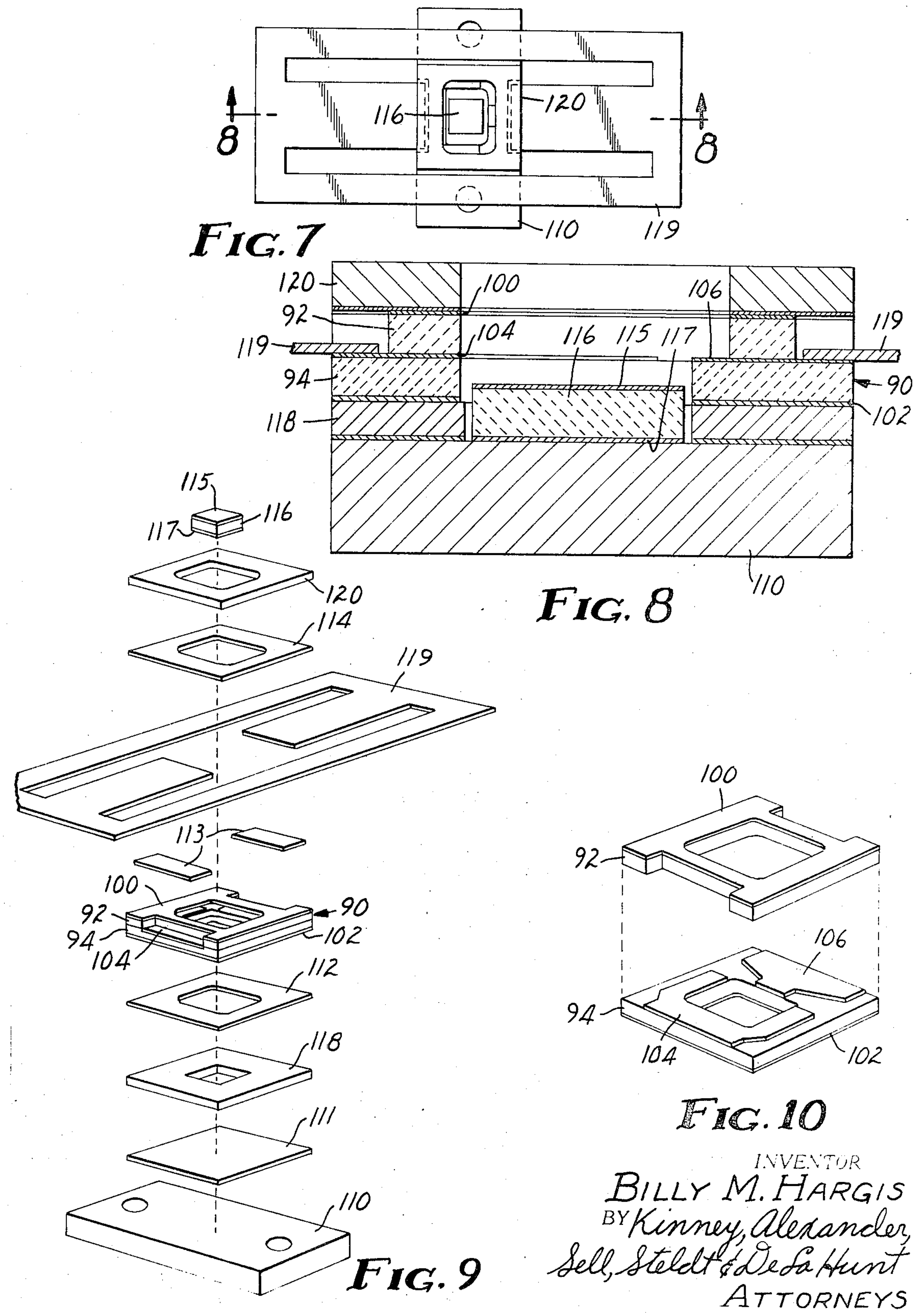
FIG. 7 and 8 show plan and cross-sectional views respectively of an hermetic power package in another embodiment of this invention.
FIG. 9 shows an exploded view of the hermetic power package of FIGS. 7 and 8.
FIG. 10 shows portions of the green ceramic tape employed in assembling the alumina collar used in the hermetic power package of FIGS. 7 and 9.

Another embodiment of the invention is shown in FIGS. 7, 8, 9 and 10. It will be seen from FIG. 10 that the ceramic ring 90 of FIG. 9 is made up by joining two green sheets 92 and 94 bearing conductive layers 100, 102, 104 and 106 and then firing. Although for convenience sake sheets 92 and 94 are shown with a line of division at their junctive in FIG. 9, they are, of course, integrally bonded by firing there and in FIGS. 7 and 8, although in the latter, which is a section of FIG. 7 along line 8—8 no contact of the ceramic layers is evident.

This embodiment is best understood by reference to the exploded view in FIG. 9 in which rectangular heat sink 110 forms the base to which are brazed ring 90 and beryllia wafer 116 having metal coatings 115 and 117 in the bottom and top respectively. Brazing of beryllia wafer 116 and expansion shim 118 to base 110 is assisted by brazing preform 111 and of ring 90 to expansion shim 118 by brazing preform 112. Lead frame 119 is attached to contact surfaces 104 and 106 of ring 90 using the pair of brazing preforms 113 and low expansion ring 120 is brazed to the upper surface 100 of ring 90 using brazing preform 114. Ring 120 providing a suitable surface for attachment of a lid (not shown) after mounting a power unit (not shown) within the container. Brazing metal is not shown in FIG. 8 and the metal surfaces joined by brazing are not shown separately. For the same reason, indicia are not applied to such metallic surfaces in either FIGS. 7 or 8 where an integral unit is shown. The assembled unit of FIGS. 7 and 8 is conveniently gold plated by tumbling or other suitable technique.

It will be apparent to those skilled in the art that numerous other variations in structure are possible within the scope of the invention. For example, by modification of the ceramic ring to have numerous leads or to be of particular shapes or sizes.

What is claimed is:

1. A package adapted for a power-consuming chip device comprising:

A. A metallic heat conductive base

B. A low expansion metallic shim brazed to said base and,

C. A lead-bearing alumina ceramic collar having metallic surfaces at least partially covering the top and bottom surfaces, said collar being sealed to said base by brazing to said shim and surrounding an area of said base adapted to receive said chip device.

2. A package adapted for a power-consuming chip device according to claim 1 having a substantially central opening in the low expansion metallic shim approximately corresponding to the area surrounded in the lead-bearing ceramic collar.

3. A package adapted for a power-consuming chip device according to claim 1, having a bilaterally metal-coated beryllia chip attached to the base within the area surrounded by the ceramic collar and adapted for attachment of a chip device to the base with electrical insulation and thermal conduction.

4. A package adapted for a power-consuming chip device according to claim 1 wherein a low expansion metallic ring is attached to the upper surface of the ceramic collar to provide a base for attachment of a covering lid.

* * * * *